United States Patent
Chan et al.

(10) Patent No.: US 10,528,513 B1
(45) Date of Patent: Jan. 7, 2020

(54) CIRCUIT FOR AND METHOD OF PROVIDING A PROGRAMMABLE CONNECTOR OF AN INTEGRATED CIRCUIT DEVICE

(71) Applicant: Xilinx, Inc., San Jose, CA (US)

(72) Inventors: Chee Chong Chan, Singapore (SG); Warren E. Cory, Redwood City, CA (US); Jason R. Bergendahl, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 15/967,473

(22) Filed: Apr. 30, 2018

(51) Int. Cl.
*G06F 1/3296* (2019.01)
*G06F 13/40* (2006.01)
*H03K 19/0175* (2006.01)
*G06F 1/10* (2006.01)
*G01R 31/317* (2006.01)
*G06F 17/50* (2006.01)

(52) U.S. Cl.
CPC ... *G06F 13/4068* (2013.01); *G01R 31/31705* (2013.01); *G06F 1/10* (2013.01); *G06F 1/3296* (2013.01); *H03K 19/017581* (2013.01); *G06F 17/505* (2013.01)

(58) Field of Classification Search
CPC .............................. G06F 17/505; G06F 1/3296
See application file for complete search history.

(56) References Cited

U.S. PATENT DOCUMENTS

| | | |
|---|---|---|
| 7,382,823 B1 | 6/2008 | Cory |
| 7,623,660 B1 | 11/2009 | Cory |
| 7,913,104 B1 | 3/2011 | Cory et al. |
| 8,006,021 B1 | 8/2011 | Li et al. |
| 8,245,102 B1 | 8/2012 | Cory et al. |
| 8,301,988 B1 | 10/2012 | Cory et al. |
| 8,411,703 B1 | 4/2013 | Cory |
| 8,612,789 B2 | 12/2013 | Taylor et al. |
| 8,667,192 B2 | 3/2014 | Allaire et al. |
| 8,913,601 B1 | 12/2014 | Kaviani |
| 9,037,807 B2 | 5/2015 | Vorbach |
| 9,106,229 B1* | 8/2015 | Hutton ................ H03K 19/173 |
| 9,135,213 B2 | 9/2015 | Taylor et al. |
| 9,170,812 B2 | 10/2015 | Vorbach et al. |
| 9,250,908 B2 | 2/2016 | Vorbach et al. |
| 9,454,498 B1 | 9/2016 | Allaire et al. |
| 9,552,047 B2 | 1/2017 | Vorbach et al. |
| 9,665,509 B2 | 5/2017 | Ansari et al. |
| 9,696,789 B2 | 7/2017 | Ahmad et al. |
| 2012/0319730 A1* | 12/2012 | Fitton ............ H03K 19/017581 326/41 |
| 2018/0081696 A1* | 3/2018 | Kim ..................... G06F 17/505 |

* cited by examiner

*Primary Examiner* — Zachary K Huson
(74) *Attorney, Agent, or Firm* — John J. King

(57) ABSTRACT

An integrated circuit comprises programmable resources; a plurality of hard blocks; and a programmable connector coupled to the programmable resources, the plurality of hard blocks; wherein the programmable connector is configurable to route signals between a first hard block and a second hard block in a first mode of operation and to route signals between the first hard and the programmable resources in a second mode of operation.

20 Claims, 16 Drawing Sheets

US 10,528,513 B1

CIRCUIT FOR AND METHOD OF PROVIDING A PROGRAMMABLE CONNECTOR OF AN INTEGRATED CIRCUIT DEVICE

FIELD OF THE INVENTION

The present invention relates generally to integrated circuit devices, and in particular to a circuit for and method of providing a programmable connector of an integrated circuit device.

BACKGROUND OF THE INVENTION

Integrated circuit devices can have circuits implemented in different ways. For example, an application specific integrated circuit (ASIC) includes circuits which are hardened, or implemented as fixed circuits. The hard blocks of an ASIC may receive different signals to implement different functions, but the circuit elements making up the hard blocks are not reconfigurable. In contrast, Programmable Logic Devices (PLDs) comprise programmable resources that are reconfigurable to implement different functions. Some integrated circuits may comprise both hard blocks and programmable resources that are reconfigurable to implement different functions.

However, using programmable resources to provide connections between hard blocks has several disadvantages. For example, the use of programmable resources to provide connections between hard blocks may have lower performance due to the limitations of the programmable resources, such as programmable interconnect elements. The use of programmable resources may also have high latency, high power, and significant use of silicon area. Such arrangements may also require a more complex use model for an end customer of the integrated circuit device.

Accordingly, there is a need for circuits for and methods of implementing a programmable connector in an integrated circuit device.

SUMMARY OF THE INVENTION

An integrated circuit is described. The integrated circuit comprises programmable resources; a plurality of hard blocks; and a programmable connector coupled to the programmable resources, the plurality of hard blocks; wherein the programmable connector is configurable to route signals between a first hard block and a second hard block in a first mode of operation and to route signals between the first hard and the programmable resources in a second mode of operation.

A method of enabling a multi-mode operation of programmable resources is also described. The method comprises providing programmable resources; providing a plurality of hard blocks; and coupling a programmable connector to the programmable resources and the plurality of hard blocks; wherein the programmable connector is configurable to route signals between a first hard block and a second hard block in a first mode of operation and to route signals between the first hard and the programmable resources in a second mode of operation.

DETAILED DESCRIPTION OF THE DRAWINGS

Figure 1:
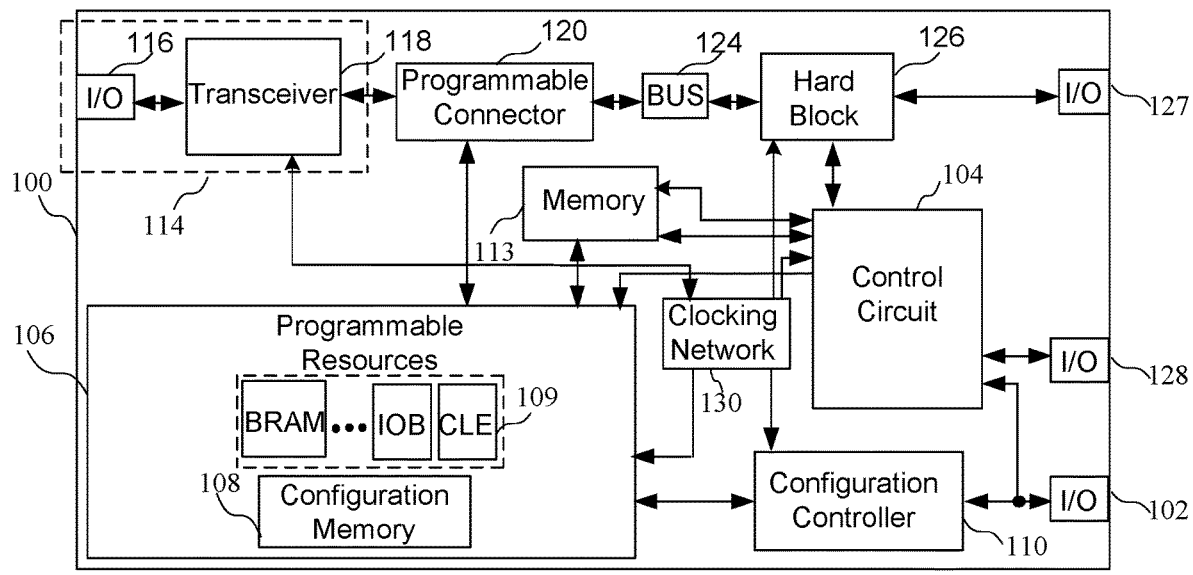
FIG. 1 is a block diagram of an integrated circuit having a programmable connector.

Circuits and methods of providing a programmable connector are described. The programmable connector enables connections between different hard blocks of an integrated circuit, such as between a data transceiver (e.g. a gigabit transceiver (GT) circuit) and an interface circuit (e.g. a Peripheral Component Interconnect Express (PCIe) interface circuit, which may include a Cache Coherent Interconnect for Accelerators (CCIX)), and between hard blocks and programmable resources. The circuits and methods use a modular and programmable design to allow variable selection of multiple GT lanes or quads to be connected to a PCIe core, depending on protocol use modes.

According to some implementations, a programmable connector provides programmable connectivity options between hard Intellectual Property (IP) blocks, while also providing bypass and debug mode options to allow access to hard IP blocks via programmable logic (PL) for monitoring or override purpose. The circuits and methods may use optimized multiplexers and cascading design elements between quads to achieve better performance with lesser vertical and horizontal routing tracks, and hence minimizes congestion issues in layout. The circuits and methods may also use configurable pipeline registers to reduce the skew and balance the latency across multiple quads when more than one quad is cascaded. The circuits and methods may also use programmable clock tree delay logic to help to balance the clock skew between adjacent Quads resulting from the clock network distributions across Quads.

According to some implementations, the circuits and methods present a programmable connector block which provides dedicated connectivity between Hard Intellectual Property (IP) blocks within a field programmable gate array (FPGA) device, without relying on the use of Programmable Logic (PL) or other programmable resources in an FPGA. That is, the programmable resources could be inactive, where the programmable resources are for example not configured or are not configured and powered up. After the programmable resources are active for example by being configured or configured and powered up, the programmable connector can be used to communicate with the programmable resources after they are active. By way of example, these hard IP blocks may be Gigabit Transceivers (GT) and a PCIe/CCIX media access control (MAC) core associated with a Processor Subsystem (PS) coupled to the PCIe/CCIS MAC core. The proposed invention supports a processing unit use model which uses programmable resources, such as elements of a Field Programmable Gate Array (FPGA) which are also known as fabric of an FPGA, as a reconfigurable accelerator. The circuits and methods support the usage of multiple transceiver lanes and PCIe/CCIX core together, without configuring or powering up the PL or other programmable resources in an FPGA. For example, conventional devices may not support an arrangement where certain hard blocks of an integrated circuit device are always on while other portions of the integrated circuit device and may be powered down. The programmable connector design according to some implementations may be used to provides bypass and debug mode options to allow the use of the PL for monitoring or override purposes.

While the specification includes claims defining the features of one or more implementations of the invention that are regarded as novel, it is believed that the circuits and methods will be better understood from a consideration of the description in conjunction with the drawings. While various circuits and methods are disclosed, it is to be understood that the circuits and methods are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the circuits and methods.

Turning first to FIG. 1, a block diagram of an integrated circuit device 100 having a programmable connector is shown. In particular, an input/output port 102 is coupled to a control circuit 104 that controls programmable resources 106 having configurable logic elements 109, and other elements such as BRAMs and IOBs, which will be described in more detail in reference to FIG. 17. Configuration data may be provided to the configuration memory 108 by a configuration controller 110. The configuration data enables the operation of the programmable resources 106. A memory 113 may be coupled to the control circuit 104 and the programmable resources 106.

A first hard block 114, shown here by way of example as having an I/O port 116 and a transceiver 118, is coupled to a programmable connector 120. The transceiver circuit 118 may be coupled to the control circuit 104, programmable resources 106 and the memory 113. While transceiver 118 is shown as a single transceiver, it should be understood that it may comprise multiple transceivers. The programmable connector 120 not only communicates with the programmable resources 106, but also communicates by way of a communication interface 124, which may be a bus for example, with another hard block 126. The hard block 126 may communicate with an I/O port 127. Other I/O ports may be coupled to circuits of the integrated circuit device, such as I/O port 128 that is coupled to the control circuit 104 as shown. A clocking network 130 is coupled to various elements of the circuit of FIG. 1 and provides clock signals necessary for the circuit to operate. It should be understood that the circuit elements and the arrangement of circuit elements are shown by way of example, and that other circuit elements or different arrangement of circuit elements of an integrated circuit device having a programmable connector to enable the communication between hard blocks and programmable resources, where the operation of the integrated circuit in different modes could be implemented. For example, while a transceiver is shown, it should be understood that the methods of implementing a programmable connector could be implemented with separate transmitters or receivers. Further, while the elements of FIG. 1 are shown on a single integrated circuit, it should be understood the various elements could be distributed among multiple integrated circuit devices or multiple chips within an integrated circuit device.

Figure 2:
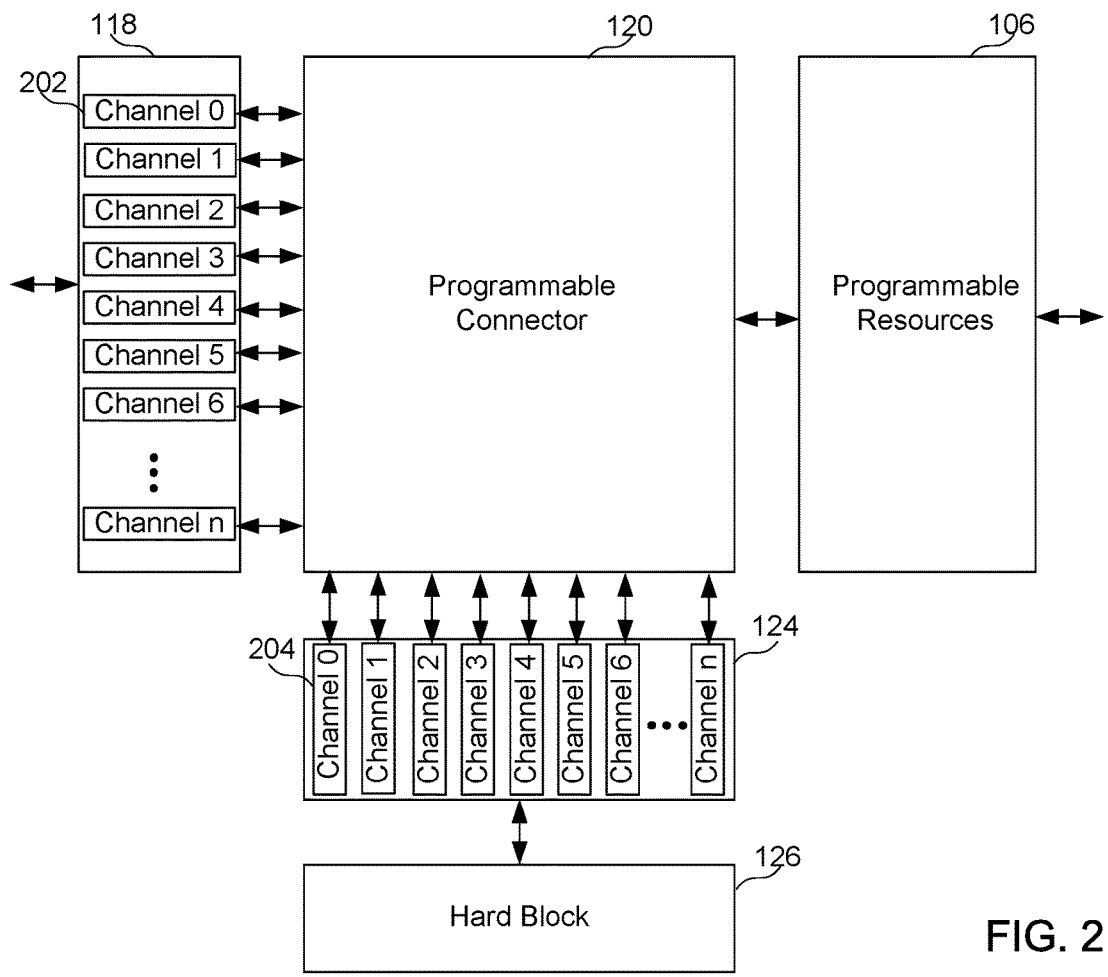
FIG. 2 is a block diagram of a portion of a circuit having a programmable connector coupled to hard blocks and programmable resources.

Turning now to FIG. 2, a block diagram of a portion of a circuit having a programmable connector coupled to hard blocks and programmable resources is shown. FIG. 2 shows the arrangement of the programmable resources 106, the transceiver 118, the programmable connector 120 having channels 202, the communication interface 124 having channels 204, and the hard block 126. The transceiver 118 comprises a plurality of channels, designated here as channels 1-$n$. While the transceiver is shown by way of example in FIG. 2 and other figures as a gigabit transceiver, it should be understood that any type of transceiver could be implemented. Similarly, the communication interface 124 comprises a plurality of channels, also designated as channels 1-$n$, and may be implemented as a hard block. The programmable connector 120 enables communication between the transceiver 118 and the communication interface 124 or between either of the transceiver 118 or the communication interface 124 and the programmable resources 106. The programmable connector 120 may be operated independently of interconnect elements of the programmable resources 106 to enable the integrated circuit to operate in different modes. For example, the programmable connector 120 may enable the transfer of data between the transceiver 118 and the communication interface 124 when the programmable resources 106 of the integrated circuit device are not configured or in a sleep or standby mode, as will be described in more detail below.

According to one implementation, the hard block 126 may comprise a processor subsystem (PS). The processor subsystem may include dual-core or quad-core configuration, and may implement an Accelerated Processing Unit (APU) for example. The APU may comprise a Real-Time Processing Unit (RPU) and tightly coupled memory (TCM). According to other implementations, the PS may comprise a dedicated Graphics Processing Unit (GPU). A number of peripherals with dedicated functions may be included in the PS. For interfacing to external memories for data or configuration storage, the PS may include a multi-protocol dynamic memory controller, a DMA controller, a NAND controller, an SD/eMMC controller and a Quad SPI controller for example. In addition to interfacing to external memories, the APU may also include a Level-1 (L1) and Level-2 (L2) cache hierarchy, and the RPU may include an L1 cache and Tightly Coupled memory subsystem, each of which may have access to a 256 KB on-chip memory.

The PS may also have a high-speed serial I/O (HSSIO) interface supporting various protocols, these include integrated block for PCI Express interface, Serial-ATA (SATA) compliant interface, DisplayPort interface, USB 3.0 compliant interface, and Serial Gigabit Media Independent Interface (SGMII) for example. High-bandwidth connectivity based on the ARM AMBA AXI4 protocol may be implemented to connect the processing units with the peripherals and to provide an interface between the PS and the programmable logic (PL).

The PS and PL can be coupled with multiple interfaces and other signals to effectively integrate user-created hardware accelerators and other functions in the PL logic that are accessible to the processors. The PS and PL can also access memory resources in the processing system. The PS I/O peripherals, including the static/flash memory interfaces may share a multi-use I/O (MIO). Extended multiplexed I/O interface (EMIO) may be implemented to allow for the use of I/Os in the PL domain for many of the PS I/O peripherals. The PS may also contain a cache coherence interconnect (CCI) for coherency protocol support, enabling cache-coherent acceleration through integrated blocks for PCI Express interface with cache coherent CCIX ports, which addresses compute acceleration applications.

Figure 3:
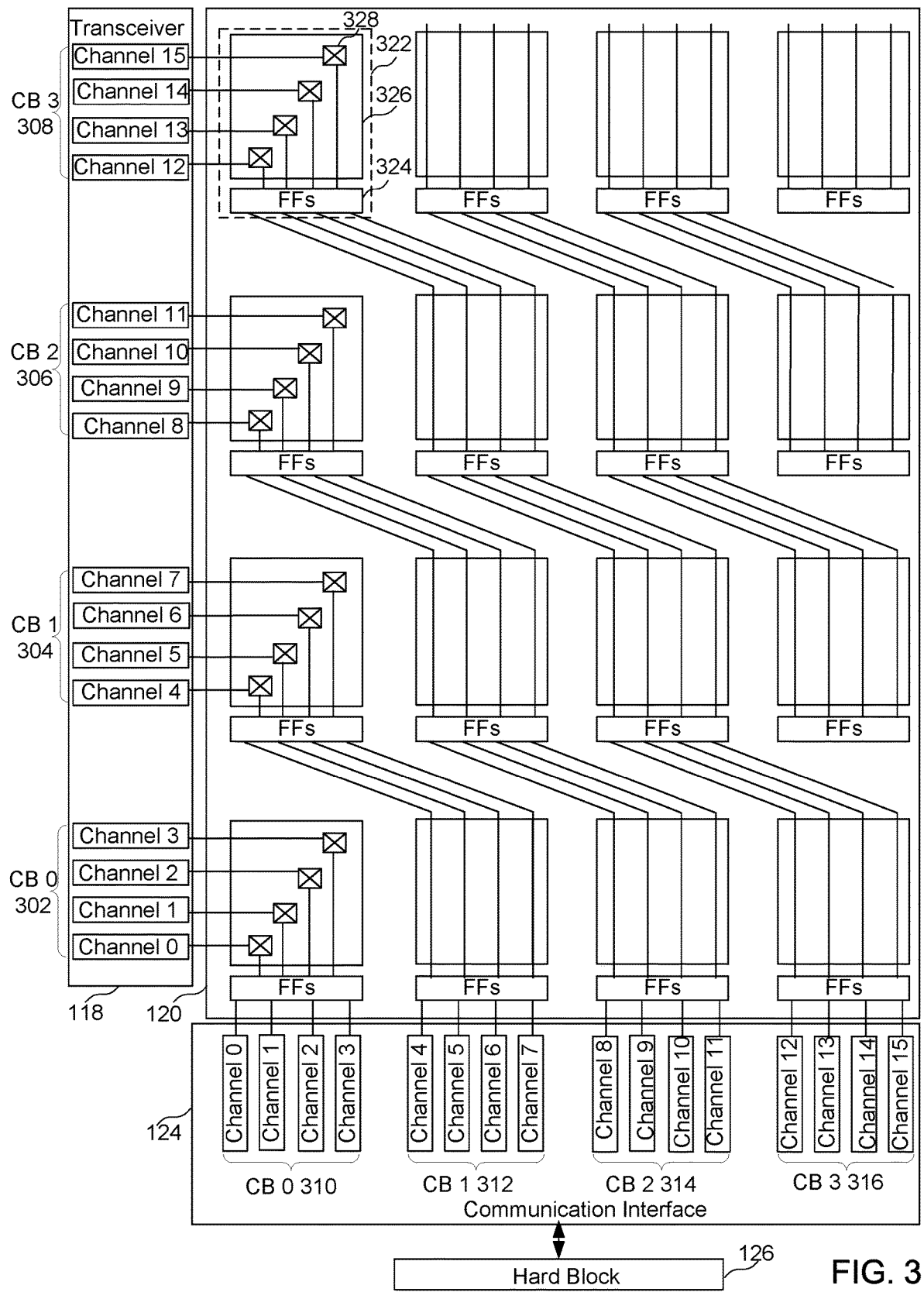
FIG. 3 is another block diagram showing switching circuits of a programmable connector.

Turning now to FIG. 3, another block diagram shows switching circuits of a programmable connector. According to the implementation of FIG. 3, the channels of the transceiver 118 and the communication interface are arranged into channel blocks (CBs), shown here as Quads (i.e. having 4 channels). More particularly, the channels of the transceiver 118 are divided into a channel block 0 302, a channel block 1 304, a channel block 2 306, and a channel block 3 308. Similarly, the channels of the communication interface 124 are divided into a channel block 0 310, a channel block 1 312, a channel block 2 314 and a channel block 3 316.

Registers and switching elements are implemented in an array to enable the routing of signals from channels of the communication interface 124 to channels of the transceiver 118. More particularly, a switching circuit 322 comprises registers 324, shown here by way of example as Flip-Flops, configured to receive data from the channels and a switch 326 that may comprise switching elements 328. The switching elements 328 may comprise multiplexers for example. While FIG. 3 shows the routing of signals from the channels of the communication interface 124 to a corresponding channel of the transceiver 118 by way of example, it should be understood that the programmable connector 120 could implement any routing of signals between desired channels in either direction. Also, the transceiver 118 is shown by way of example, and any other type of hard block could be implemented in its place.

Therefore, FIG. 3 shows the arrangement of the cascaded connector tiles in a per-Quad basis, connecting the GT Quads of the transceiver and a communication interface 124, shown here as a PCIe/CCIX interface having 16 channels, also known as lanes, as shown at the bottom. Each switching element 328 represents all the universal connectors for a single Channel. The signal connections for an upper GT Quad are "shifted" by a lower GT Quad to the appropriate PCIe/CCIX lane connections for that GT Quad. This arrangement reduces both the vertical and horizontal routing tracks across Quads and minimizes routing congestions. It also simplifies multiplexer logic for the programmable connector 120.

Figure 4:
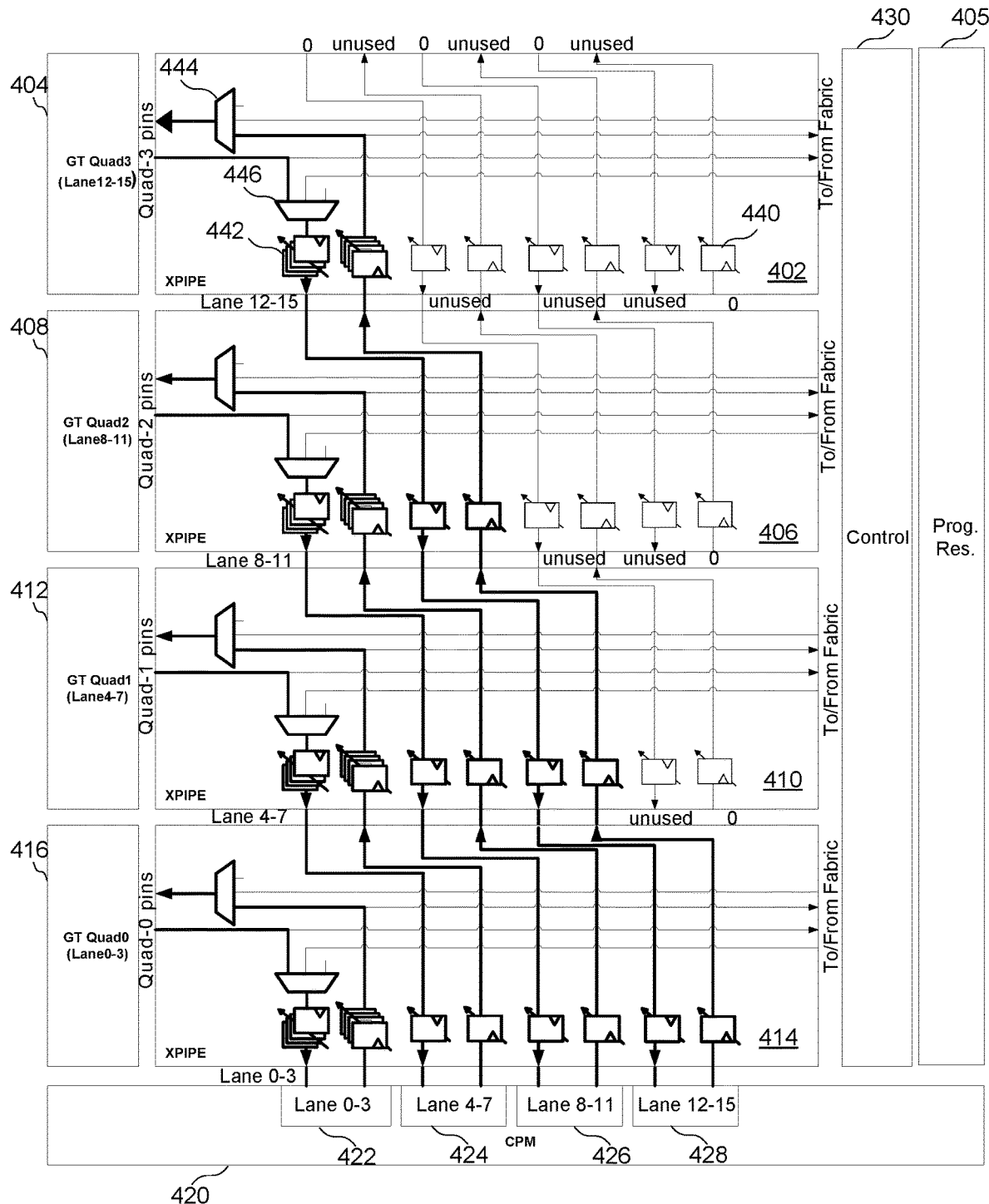
FIG. 4 is a block diagram of a programmable connector enabling the transfer of signals between hard blocks.

Turning now to FIG. 4, a block diagram of a programmable connector enabling the transfer of signals between hard blocks is shown. The implementation of FIG. 4 shows the use of multiplexers and registers to route data using channels, designated as lanes here, between a transceiver and a communication interface. More particularly, a routing circuit having multiplexers and registers enable the routing of data between channels of a transceiver and a communication interface where multiplexers and interconnect lines that are used in the transfer are shown in darker lines. It should be noted that additional resources, such as additional multiplexer, that are not used in the routing circuits may also be present.

Four routing circuits, which may be implemented in the programmable connector 120 for example, are shown coupled between channels of a transceiver and programmable resources. More particularly, a routing circuit 402 is coupled a GT Quad 3 404 and the programmable resources 405, a routing circuit 406 is coupled a GT Quad 2 408 and the programmable resources 405, a routing circuit 410 is coupled a GT Quad 1 412 and the programmable resources 405, and a routing circuit 414 is coupled a GT Quad 0 416 and the programmable resources 405. While 4 routing circuits are shown by way of example, it should be understood that other numbers of routing circuits could be implemented. A communication interface 420 comprises a plurality of quad channels, include a quad channel 422, a quad channel 424, a quad channel 426, and a quad channel 428. A control circuit 430, which may be an Native Port Interface (NPI)/clocking/system monitor for example, is configured to enable communication between each of the routing circuits 402, 406, 410 and 414 and the programmable resources.

Each of the routing circuits 402, 406, 410 and 414 comprises multiplexers and registers, which may comprise a register associated with a corresponding channel and may be flip-flops for example. Some registers 440 may comprise configurable pipeline flip-flops, as will be described in more detail below in reference to FIG. 5. Other registers 442 may comprise configurable pipeline registers having a plurality of registers as described in reference to FIG. 6 for example. The routing circuits may also comprise multiplexers 444 for routing signals from either the programmable resources 405 or the quad channels of the communication interface 420 and the quad channels of the GT transceiver. The multiplexers 446 may be implemented for routing signals from the GT Quad circuits or the programmable resources to the communication interface 420. The routing circuits 402, 406, 410 and 414 are programmable so the interconnect elements, shown here by way of example in the darker lines, and the routing by the multiplexers are configured to route the signals as desired. By way of the example of FIG. 4, the channels or lanes of the communication interface 420 are routed to corresponding channels or lanes of the GT Quads. While GT Quads are shown by way of example, it should be understood that any transceiver implemented as a hard block could be implemented.

Therefore, FIG. 4 shows multiplexer structures used in a programmable connector, and also shows the shifted connectivity between adjacent Quad tiles. With the shifted connectivity, each GT Quad signals are connected to the appropriate lanes, which may be PCIe/CCIX lanes for example, that correspond to that GT Quad. The connections may go through vertical feed-throughs depending on the Quad location, eliminating the need to add complex multiplexers for GT Quad signals coming down from routing circuits above.

Figure 5:
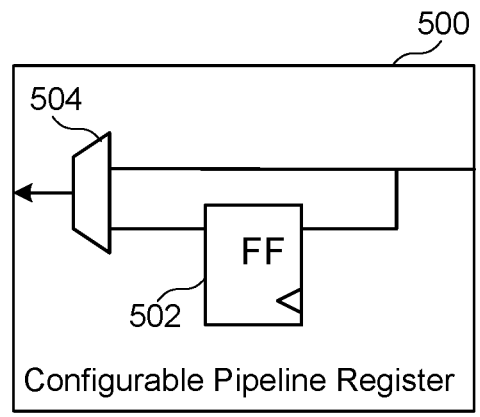
FIG. 5 is a block diagram of a configurable register having pipelining in a programmable connector for a circuit enabling a multi-mode operation.
Figure 6:
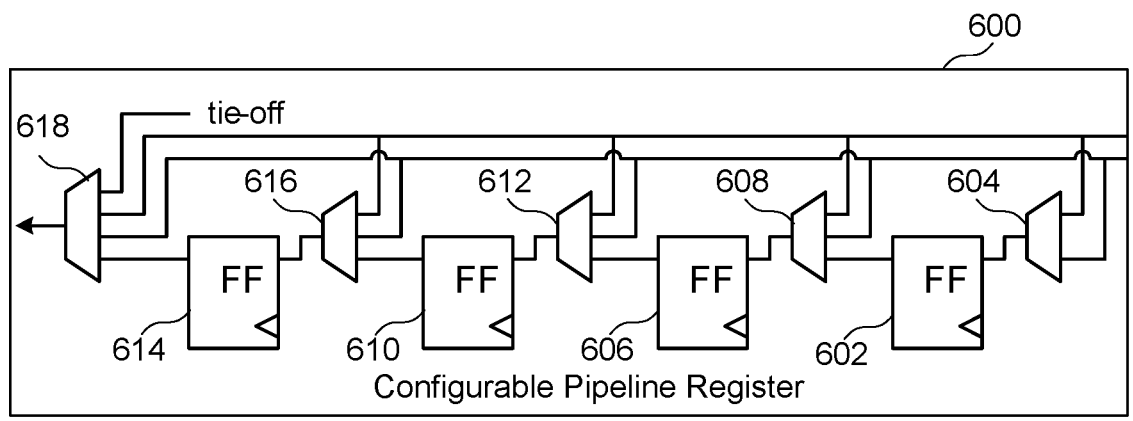
FIG. 6 is a block diagram of another configurable register having pipelining in a programmable connector for a circuit enabling a multi-mode operation.

As shown in FIGS. 5 and 6, configurable pipeline registers are added at the end of the routing circuits 402, 406, 410 and 414 to substantially reduce skew between Quad channels to manageable levels. The pipelining registers may be optionally bypassed, as shown in FIGS. 5 and 6, if timing for a given usage supports eliminating or reducing the amount of pipelining. FIGS. 5 and 6 shows examples of pipelining flip-flops, which may be used as shown in FIG. 4, where the single registers could be implemented using the programmable register of FIG. 5 and the multiple register elements at the end of the routing circuits could be implemented as shown in FIG. 6.

Referring first to FIG. 5, a block diagram of a configurable register having pipelining in a programmable connector for a circuit enabling a multi-mode operation is shown. A configurable pipeline register 500 comprises a register 502, shown here by way of example as a flip-flop (FF), and a multiplexer 504. The multiplexer 504 is able to select either the input to the configurable pipeline register 500, or a delay signal that is provided to the configurable pipeline register 500, to generate an output signal at an output of the configurable pipeline register 500.

According to the implementation of FIG. 6, a configurable pipeline register 600 comprises a plurality of registers, also shown here as flip-flops, to enable different delays in the input signal to be selected. More particularly, a first register 602 is configured to receive input data from a multiplexer 604. A second register 606 is configured to receive an output of a multiplexer 608, which is configured to receive the input signals or an output of the register 602. A third register 610 is configured to receive an output of a multiplexer 612, which is configured to receive the input signals or an output of the register 606. A fourth register 614 is configured to receive an output of a multiplexer 616, which is configured to receive the input signals or an output of the register 610. A multiplexer 618 is configured to receive the input signals or an output of the register 614. As can be seen, signals can be directly passed through the multiplexer 618, or delayed up to 4 registers.

It should be noted that signals from the upper Quads would propagate through more pipeline stages than corresponding signals from the lower Quads closer to the PCIe/CCIX, causing a difference in latency of signals from the different Quads. To address this problem, the shift register arrangement in the top half of FIG. 3 allows a variable number of flip-flops to be selected, balancing the latency across all the Quads. The shift registers and multiplexers as shown in FIG. 6 offer timing improvement, compared to an implementation using only a single 6-to-1 multiplexer at the end of the shift registers.

Figure 7:
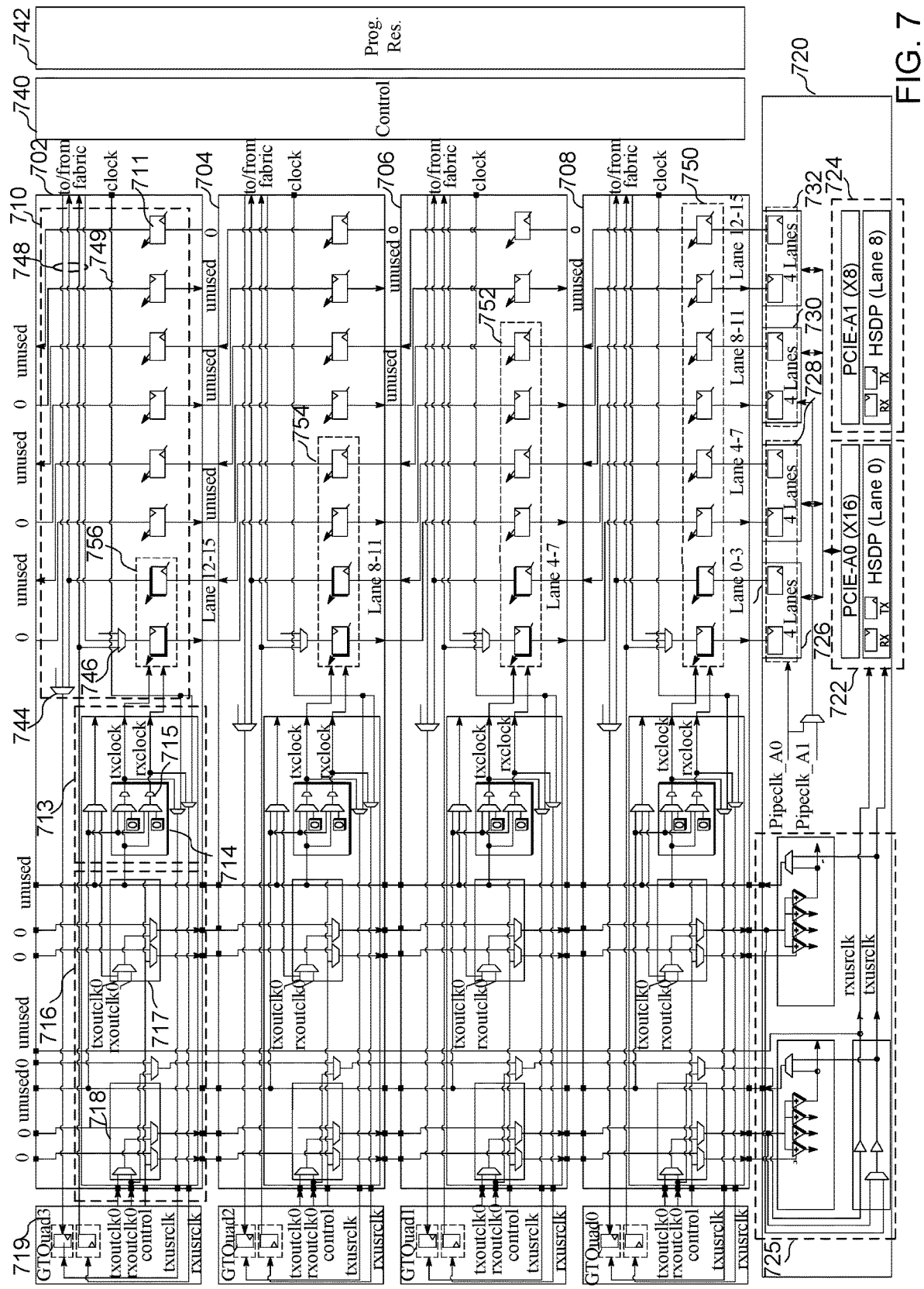
FIG. 7 is a block diagram of a circuit for connecting between data transceivers and a single hard block interface circuit.

Turning now to FIG. 7, a block diagram of a circuit for connecting between data transceivers and a single hard block interface circuit is shown. The circuit of FIG. 7 also shows the routing of clock signals. More particularly, routing circuits 702-708, which may be implemented in the programmable connector 120 for example, each comprises a routing block 710 having 8 registers 711 as shown, which may be implemented as the routing circuits 402, 406, 410 and 414 as described above in reference to FIG. 4, a clock selection circuit 713, which may comprise a multiplexer selection circuit 714 and a delay circuit 715 such as the programmable clock tree delay described in reference to FIG. 11, and a clock routing circuit 716 having a first multiplexer selection circuit 717 and a second multiplexer selection circuit 718 enabling the routing of clock signals as shown. Each of the routing circuits 702-708 is coupled to a channel block 719 of a transceiver, such as a gigabit transceiver having 4 quad channels (i.e. GT Quad0-GT Quad3). Each of the clock routing circuits 702-708 receives transmit and receive clock signals, including txoutclk0 and rxoutclk0 clock signals, where txoutclk0 is the output clock source from the transmitter of Channel 0 of the GT Quad and rxoutclk0 is the output clock source from the receiver of Channel 0 of the GT Quad. The clock selection circuit 713 selects a clock signal coupled to the routing circuits, shown here as txclock and rxclock, which may be selected from the txoutclk0 and rxoutclk0 clock signals and signals cascaded from another part of the integrated circuit.

A communication interface 720 enables the routing of data between the channel blocks 719 and hard block communication interfaces, shown here as a first communication circuit 722 and a second communication circuit 724, that represent hard blocks and enable communication with other hard blocks. The first communication circuit 722 may comprise a first interface circuit, shown here as a first PCIe circuit (PCIE-A0) adapted to communicate with 16 channels and a first high-speed debug port (HSDP), and the second communication circuit 724 may comprise a second interface circuit, shown here as a second PCIe circuit (PCIe-A1) adapted to communicate with 8 channels and a second HSDP.

The communication interface 720 also comprises a clock selection circuit 725 adapted to receive a clock signal from the clock routing circuits 716. More particularly, txusrclk and rxusrclk are clock domains that are used to interface between channel blocks 719 (i.e. GT circuits) and programmable resources 742. For a common clock mode use case, both the txusrclk and rxusrclk clock signals can be sourced from txoutclk clock signal of one of the GT channels. For other use cases, the txusrclk and rxusrclk clock signals can be sourced separately from txoutclk and rxoutclk clock signals. The txusrclk and rxusrclk clock signals can be used to clock FPGA fabric logic when the routing circuits 702-708 are operating in bypass or debug mode, as will be described in more detail below. Pipeclk A0 and pipeclk A1 are clock signals generated in first and second communication circuits 722 and 724, as the clock source to clock pipeline registers in routing circuits 702-708, as well as clock sources for txusrclk and rxusrclk clocks. The two separate pipeclk A0 and pipeclk A1 clocks allows the design to support two independent PCIe links or a combined HSDP link and PCIe link.

Although the clock signals associated with the clock selection circuit 713 and the clock routing circuit 716 are shown as the same for each of the routing circuits 702-708, it should be understood that separate clock signals for the clock selection circuit 713 and the clock routing circuit 716 allows for more flexibility in implementing the programmable connector. Having separate txoutclk0 and rxoutclk0 clock source selections allows the design to support simplex mode operation for data transmission protocols such as a 64B/66B data transmission protocol. In a simplex mode, the transmitter (TX) side of the transceivers can operate at different speed than the receiver (RX) side of the transceivers. It should also be noted that the txoutclk0 and rxoutclk0 clock sources has the flexibility of selecting among any of the GT Quads, and depends on which GT Quad is being chosen as the master channel of the multi-lane applications. Generating separate txusrclk and rxusrclk clocks also allow the simplex mode support. In addition, the clock multiplexers for txusrclk and rxusrclk clock sources also determine by whether the routing circuits 702-708 are operating in transfer mode between the GT quads and the fabric, a bypass mode or a debug mode.

The communication interface 720 may comprise a plurality of quad channel blocks, shown here as quad channel blocks 726-730, which may be implemented as described above in reference to Quad channels 424-428. A control block 740 enables communication with the programmable resources 742, also commonly known as the fabric, and may include NPI, clocking and system monitor functions. The routing circuits 702-708 comprise elements for routing data between the GT Quads, the communication interface 720, and the programmable resources 742, including multiplexers 744 and 746, where multiplexer 744 is configured to route data between from communication interface 720 and the programmable resources to the Quad GTs, while multiplexers 746 enable communication from the Quad GTs and the programmable resources to the communication interface 720. Interconnect elements 748 enable communication between the fabric and the Quad GTs, while clock lines 749 enable the routing of clock signals from the routing resources. As shown in the example of FIG. 7, different registers are used to route signals, where a first block of registers 750 of the routing circuit 708 is used, a second block of registers 752 of the routing circuit 706 is used, a third block of registers 754 of the routing circuit 704 is used, and a fourth block of registers 756 of the routing circuit 702 is used, similar to the arrangement described above in reference to FIG. 4.

The number of GT lanes of the channel blocks 719 and PCIe/CCIX lanes of the communication interface 720 that are used may be programmable in a per Quad basis or in the multiple of four lanes, i.e. 4, 8, 12 or 16 lanes. The circuit of FIG. 7 is configured to support up to two independent PCIe/CCIX links. FIG. 7 is similar to the implementation of FIG. 4, but further includes clock generation and distribution in the routing circuits 702-708 and PCIe/CCIX tiles. The clock distribution networks may be repeated in each routing circuit, since each routing circuit has the same layout. The clock distribution network allows distributions of two independent clock source from different GT Quads, and hence enables two independent PCIe/CCIX link operations. FIG. 7 shows the configured design when operating with a single X16 lanes PCIe/CCIX link, whereas FIG. 8 shows the configured design when operating with two independent X8 lanes PCIe/CCIX link.

Figure 8:
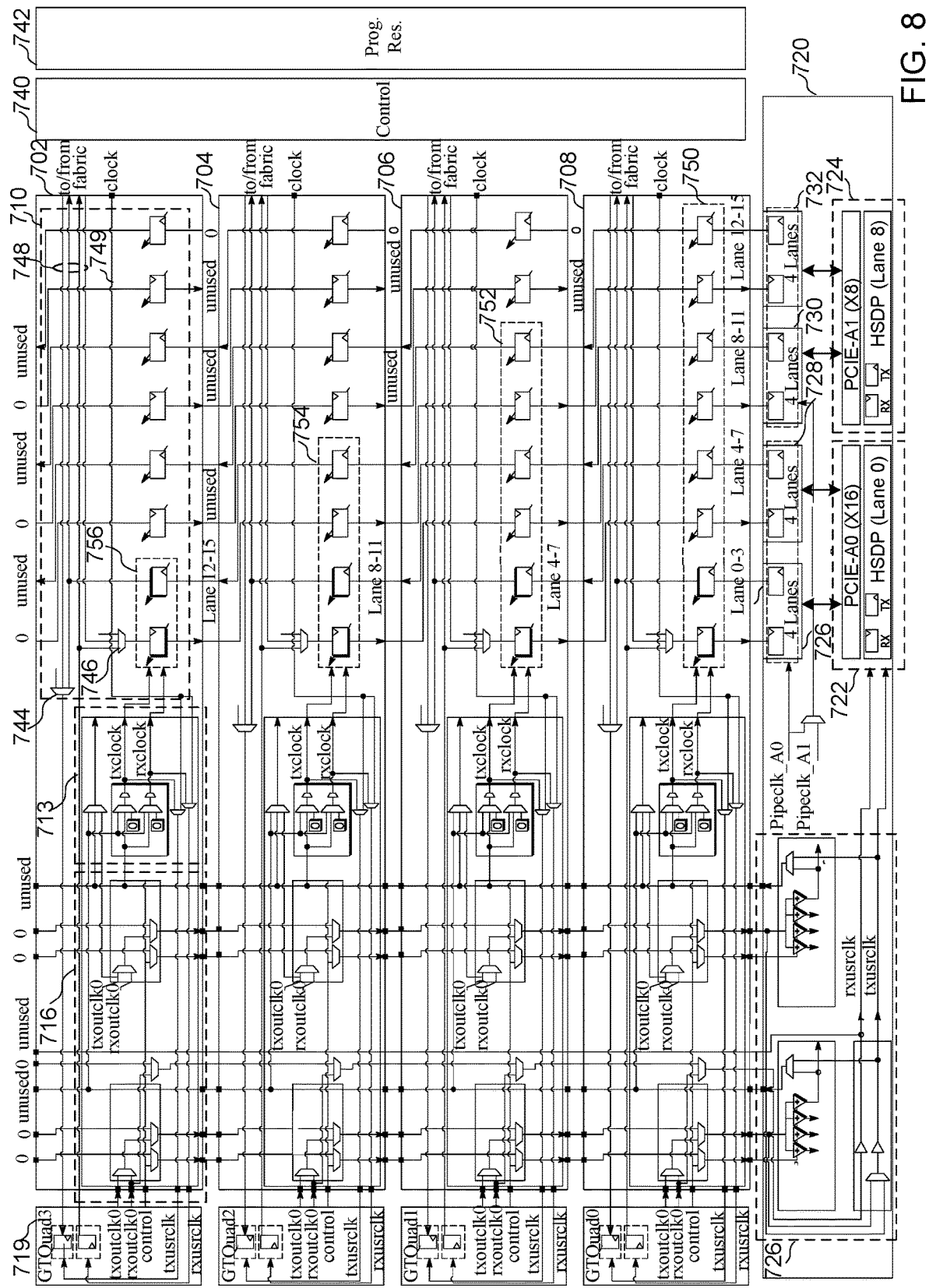
FIG. 8 is a block diagram of a circuit for connecting between data transceivers and multiple hard block interface circuits.

More particularly, a block diagram of FIG. 8 shows a circuit for connecting between data transceivers and multiple hard block interface circuits. While the circuit of FIG. 7 relies upon a single PCIe circuit (PCIE_A0), the circuit of FIG. 8 uses the PCIe circuits of both the first and second communication circuits 722 and 724. Unlike FIG. 7 where data is routed from the communication circuit 722 to each of the quad channel blocks 726-730, the communication circuit 722 routes data to the quad channel blocks 726 and 728, while the communication circuit 724 routes data to the quad channel blocks 728 and 730.

Figure 9:
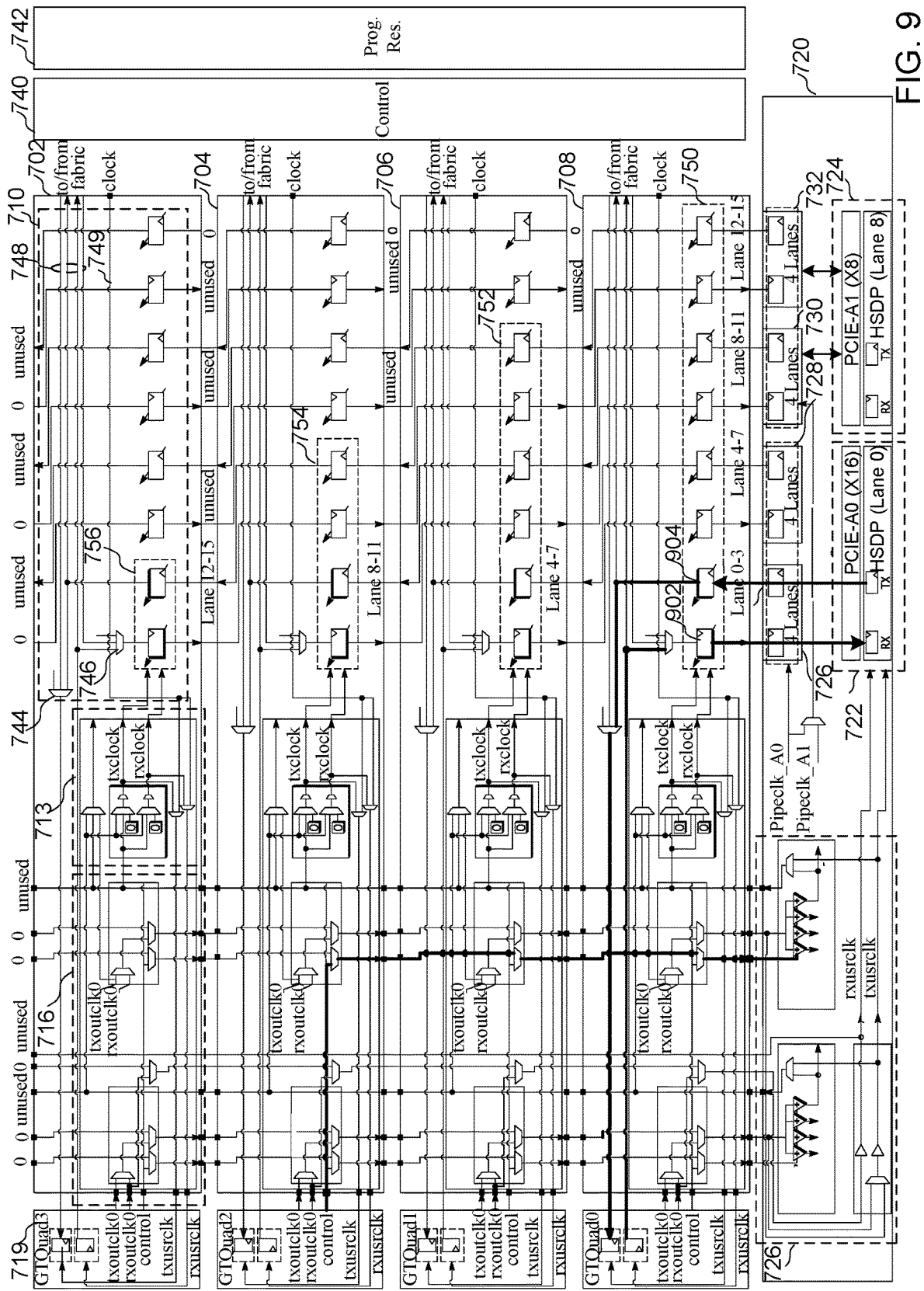
FIG. 9 is a block diagram of a circuit for connecting between data transceivers and hard block interface circuits that uses a hard block user interface to route clock signals.
Figure 10:
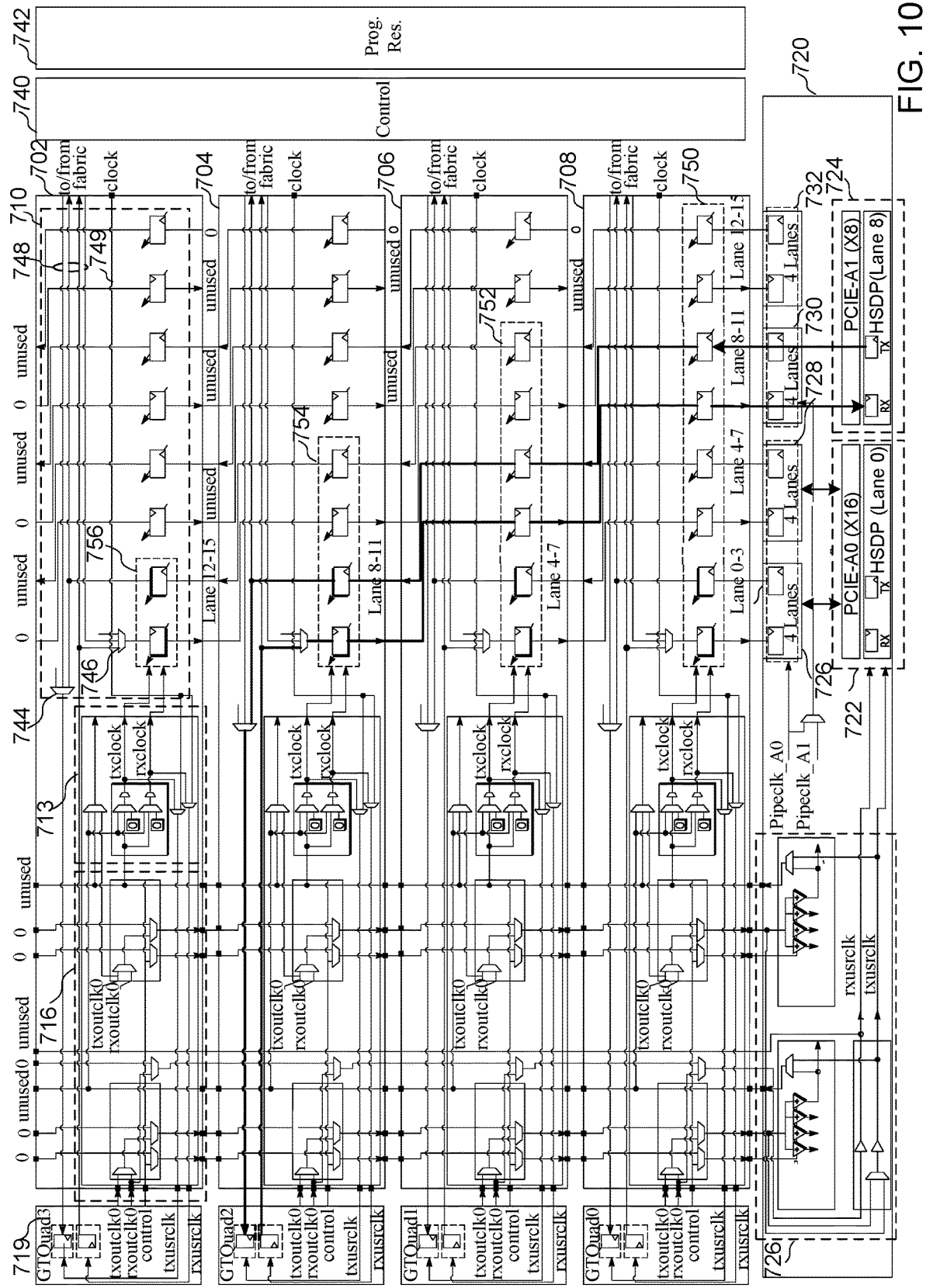
FIG. 10 is a block diagram of another circuit for connecting between data transceivers and hard block interface circuits that uses a hard block user interface to route clock signals.

The clocking architecture can be used to connect multiple Hard IP blocks simultaneously. FIG. 9 and FIG. 10 shows one of the links being used to connect to High Speed Debug Port (HSDP) of a Processor System (PS) through a serial point-to-point communication block for example, while the other remaining link can still be configured to operate as single X8 lanes PCIe/CCIX link. As shown in FIG. 9, the HSDP of the communication circuit 722 is used for routing clock signals in a debug mode by way of quad channel blocks 726 and 728 and registers 902 and 904, while the PCIE-A1 block of the second communication circuit 724 is used to route data by way of quad channel blocks 730 and 732. In the implementation of FIG. 10, the HSDP of the communication circuit 724 is used for routing clock signals in a debug mode by way of quad channel block 730, while the PCIE-A1 block of the second communication circuit 722 is used to route data by way of quad channel blocks 726 and 728.

Figure 11:
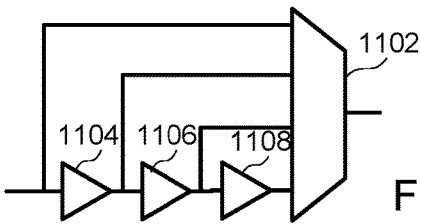
FIG. 11 is a block diagram of a programmable clock tree delay that could be used in a programmable connector.

Turning now to FIG. 11, a block diagram of a programmable clock tree delay multiplexer 1102 operating as a clock selection circuit and having a plurality of delay elements 1104-1108 that could be used in a programmable connector, such as a programmable multiplexer, is shown. Since the clock source is distributed from the bottom routing circuit 414 to the top routing circuit 402, there will be clock skew between Quad GTs. In order to minimize the number of buffers added to the design to resolve hold time violations, programmable clock tree delay cells, such as shown in FIG. 11, could be added at each clock multiplexer groups. Since the TX and RX data paths are in the opposite directions for the clock network distribution between Quads, separate programmable clock tree delay cells may be allocated for TX and RX clocks. FIG. 11 shows the programmable clock tree delay logic, which may be placed after a clock selection multiplexer in FIGS. 7-10. The clock tree delay difference between two adjacent routing circuits 402, 406, 410 and 414 can be programmed to a unit delay depending on the clock propagation delay numbers reported from a place and route flow. By way of example, 1 unit delay may be equivalent to the total clock propagation delay of the vertical clock source from the routing circuit 414 at the bottom to the adjacent routing circuit 410 above it.

Figure 12:
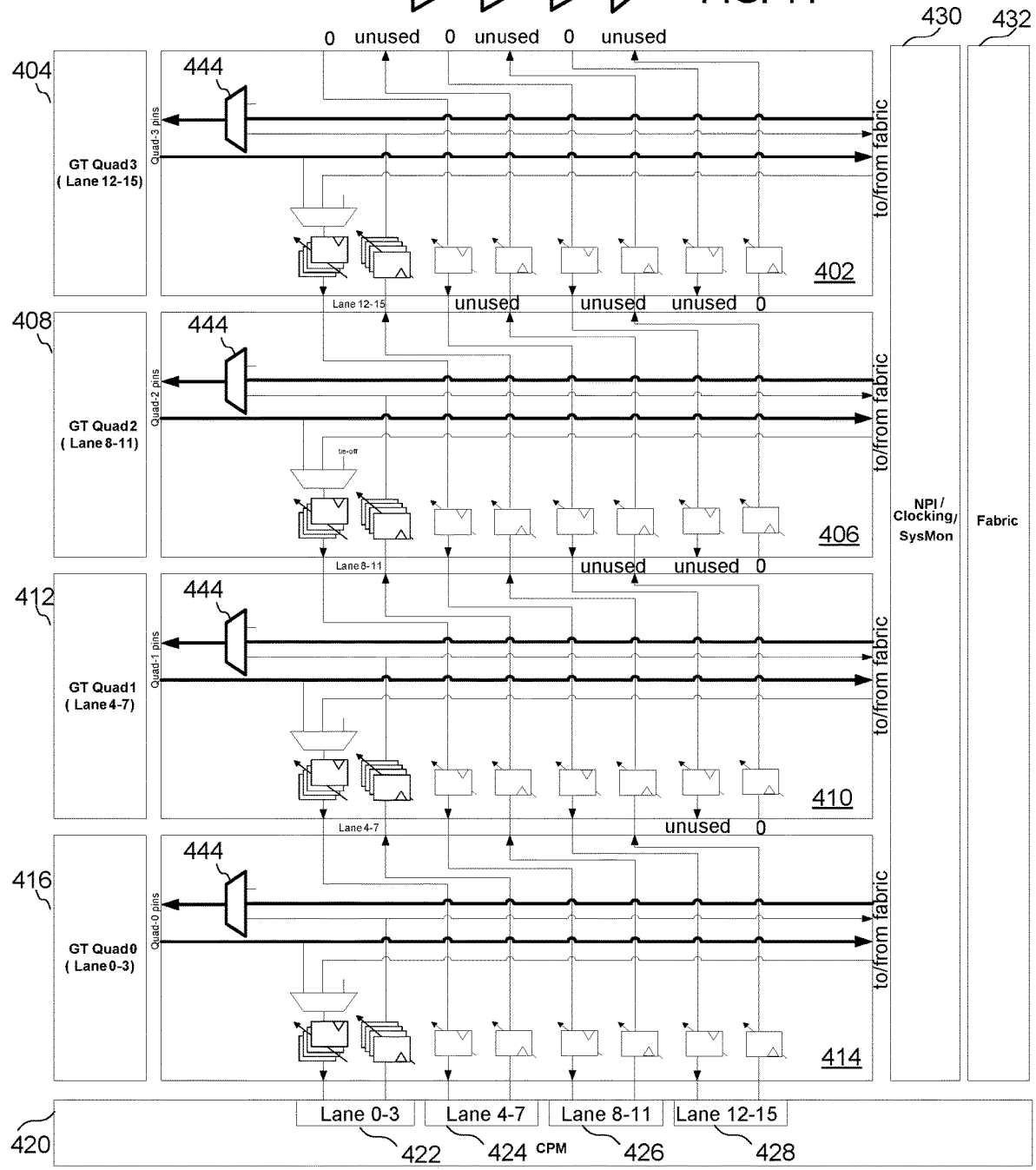
FIG. 12 is a block diagram showing the routing of signals between hard blocks, comprising data transceivers, and programmable resources.
Figure 13:
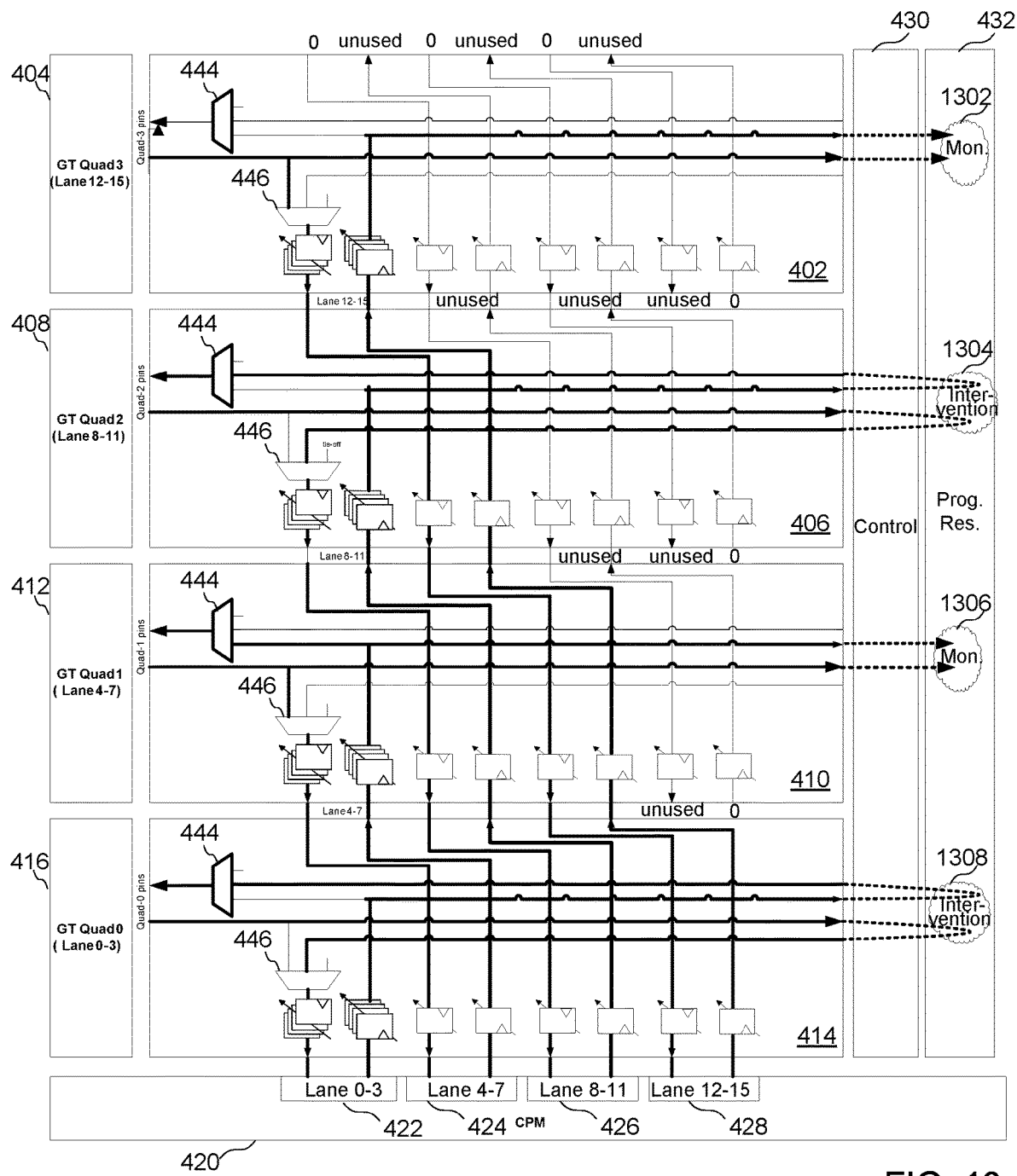
FIG. 13 is a block diagram showing the routing of signals between hard blocks, comprising data transceivers and interface circuits, and programmable resources.

The programmable connector of FIG. 11 also supports other operating modes include bypass and debug modes. The highlighted paths in FIG. 12 and FIG. 13 show the configuration when operating in bypass mode and debug mode, respectively. In Bypass mode, direct connection between the GT Quads 404, 408, 412 and 416 and the programmable resources 432 is enabled for use cases using programmable resources, as shown in FIG. 12. There are two options for debug mode operations as shown in FIG. 13. The first is a debug mode with a fabric monitor (shown by way of example with monitor 1302 and monitor 1306), where a direct connection is provided between a GT and a PCIe/CCIX circuit, with signals also copied into the monitors 1302 and 1306 for monitoring purpose. The second is a debug mode with fabric override by intervention circuits 1304 and 1308, where a connection between a GT and a PCIe/CCIX are routed via programmable resources to allow programmable resource logic to modify the system operation.

Figure 14:
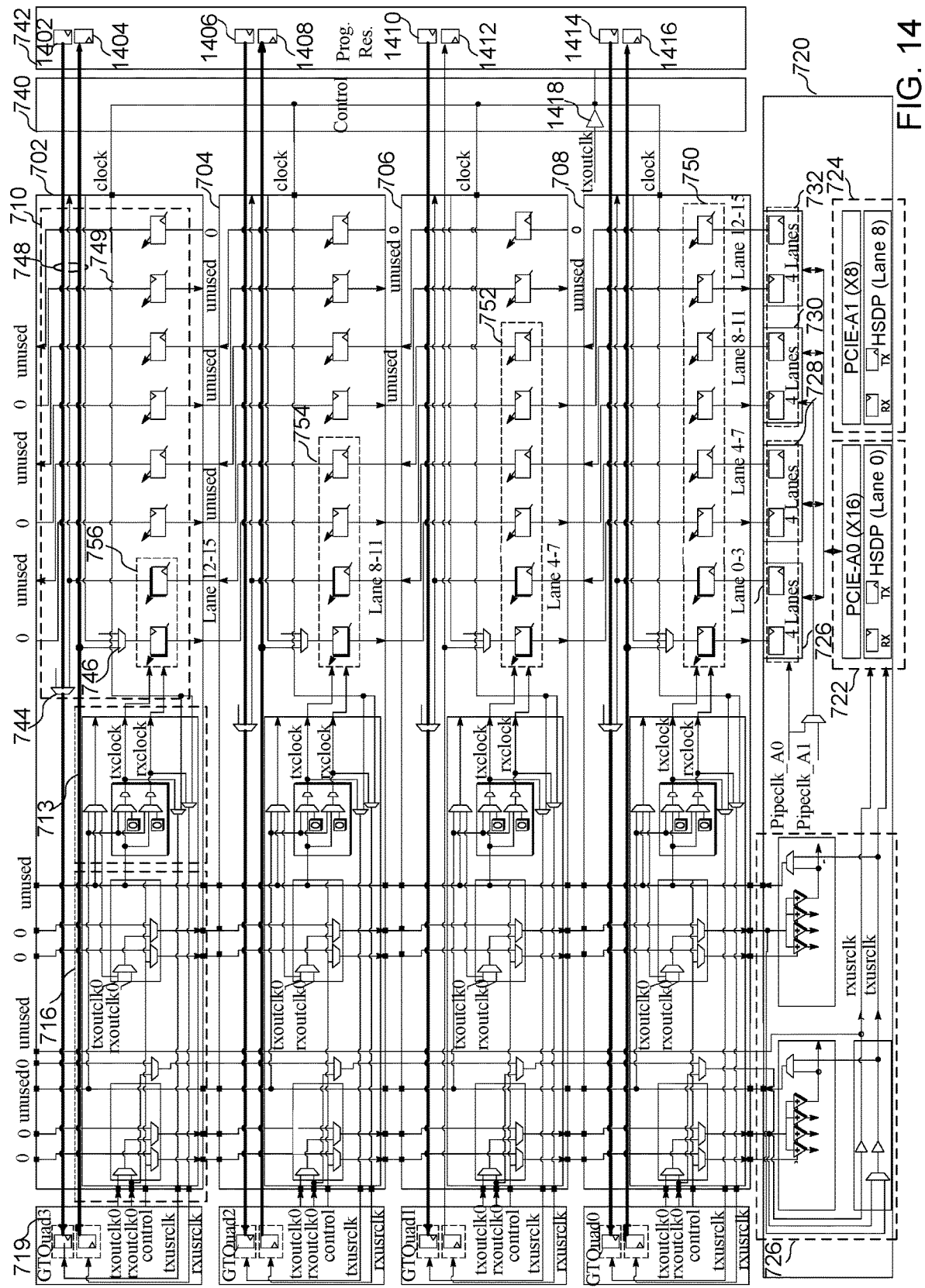
FIG. 14 is a block diagram showing the routing of clock signals in a by-pass operation.

FIG. 14 shows the operation of the circuit in a by-pass mode. In this mode, the programmable resources are powered up and connected to the GTs, via the programmable connector logic. More particularly, registers 1402 and 1404 enable the transmission of data with the programmable resources by way of the routing circuit 702, registers 1406 and 1408 enable the transmission of data with the programmable resources by way of the routing circuit 704, registers 1410 and 1412 enable the transmission of data with the programmable resources by way of the routing circuit 706, and registers 1414 and 1416 enable the transmission of data with the programmable resources by way of the routing circuit 708. A clock signal can be provided to the programmable resources by way of a buffer 1418.

Figure 15:
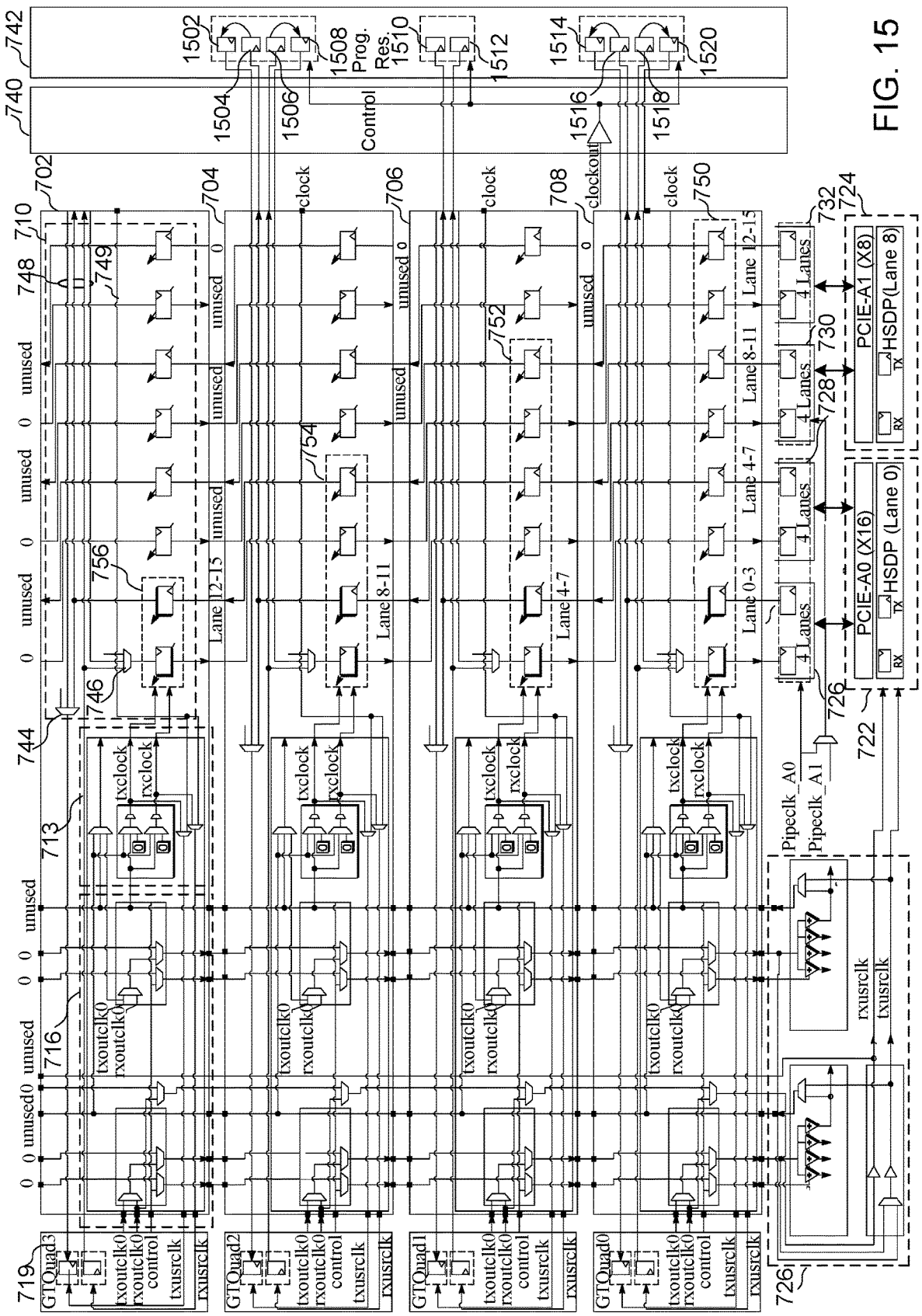
FIG. 15 is a block diagram showing the routing of signals between hard blocks, comprising data transceivers and interface circuits, and programmable resources enabling a debug operation.

FIG. 15 shows the operation of the circuit in a debug mode clocking. More particularly, registers 1502, 1504, 1506, and 1508 enable a debugging operation associated with GT Quad2, registers 1510 and 1512 enable a debugging operation associated with GT Quad1, and registers 1514, 1516, 1518, and 1520 enable a debugging operation associated with GT Quad0. The TXOUTCLK clock multiplexer selects PIPECLK clock source, in which this is the same PIPECLK that used to clock the pipeline registers, as well as return as txusrclk and rxusrclk and to clock the GT registers. The txoutclk output clock from the routing circuits is used to drive the clocking Column BUFG_GT, and the BUFG_GT output clock is then used to clock the registers in programmable resources which interface with routing circuit or GT data path. The txoutclk clock source from PIPECLK clocks is taken after the programmable clock tree delay multiplexer for a TX clock. In order to better close setup and hold time for the routing circuit to the programmable resource interface in debug mode, it is possible to use a DPLL in clocking column to deskew the clock tree in programmable resources to match with the routing circuit internal clock tree.

Figure 16:
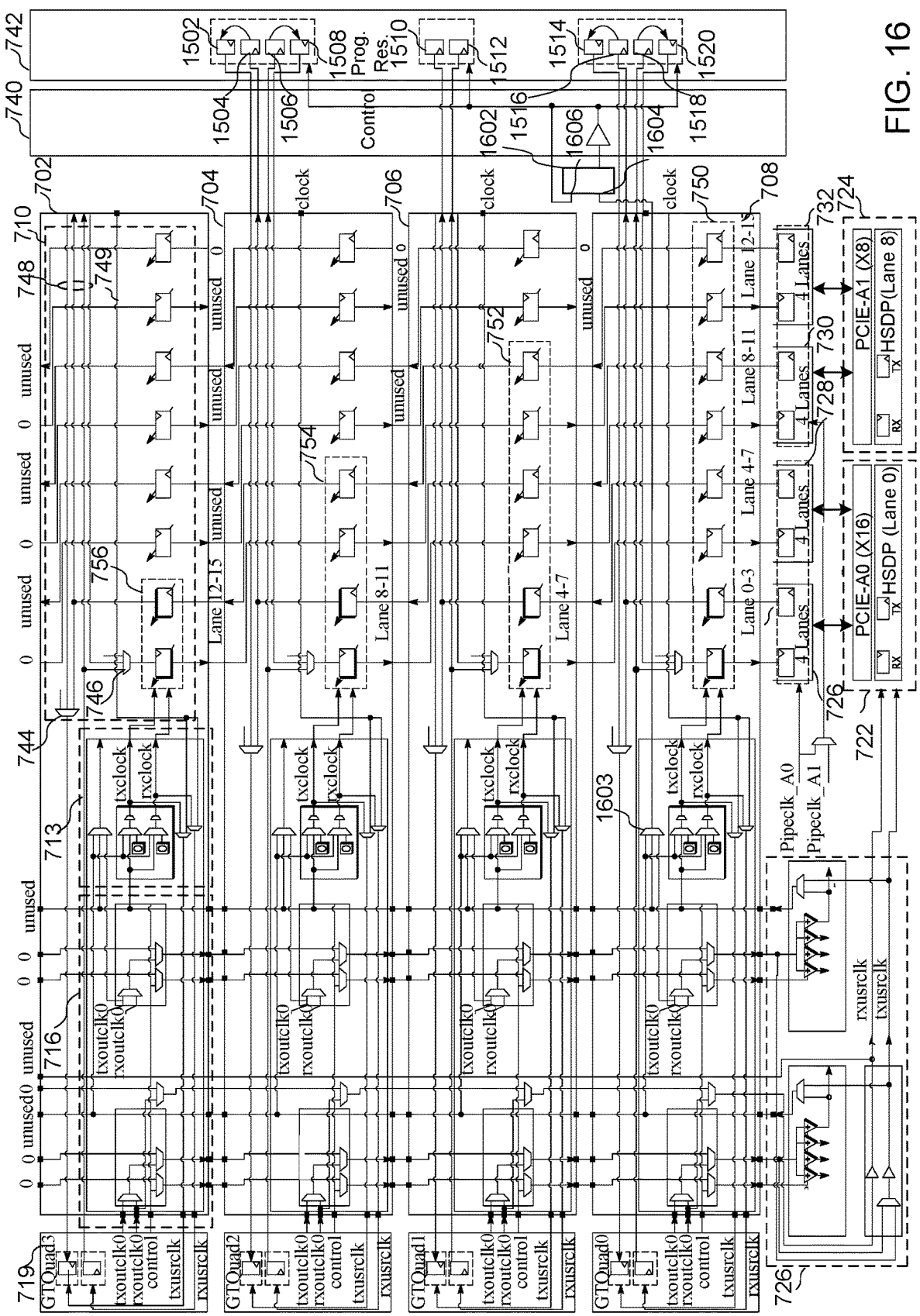
FIG. 16 is a block diagram the routing of signals between hard blocks, comprising data transceivers and interface circuits, and programmable resources enabling a debug operation using a digital phase-locked loop (DPPL)

Turning now to FIG. 16, a block diagram the routing of signals between hard blocks, comprising data transceivers and interface circuits, and programmable resources enabling a debug operation using a digital phase-locked loop (DPPL) used in a Debug mode clocking is shown. In addition to the elements of FIG. 15 for implementing a debug operation, the circuit of FIG. 16 comprises a DPLL 1602, which receives a clock signal from a clock selection circuit 713 by way of a clock selection multiplexer 1603 for example at a clock input 1604 and receives a feedback clock signal at a clock deskew input 1606. The TXOUTCLK clock multiplexer 1603 may selects a PIPECLK clock source which may be used to clock the pipeline registers of the routing circuits 702-708, as well as return as txusrclk and rxusrclk to clock the registers of the GT Quads. The txoutclk output clock from the routing circuits 702-708 is used to drive the clocking of the channel blocks 719, and an output clock of the channel block 719 is then used to clock the registers in PL which interface with the routing circuits 702-708 or a GT data path. The TXOUTCLK clock source is taken after the programmable clock tree delay multiplexer 1102 for TX clock. In order to better close setup and hold time for routing circuit to a PL interface in debug mode, it is possible to use DPLL in clocking column to deskew the clock tree in the PL to match with an internal clock tree of the routing circuits 702-708.

Figure 17:
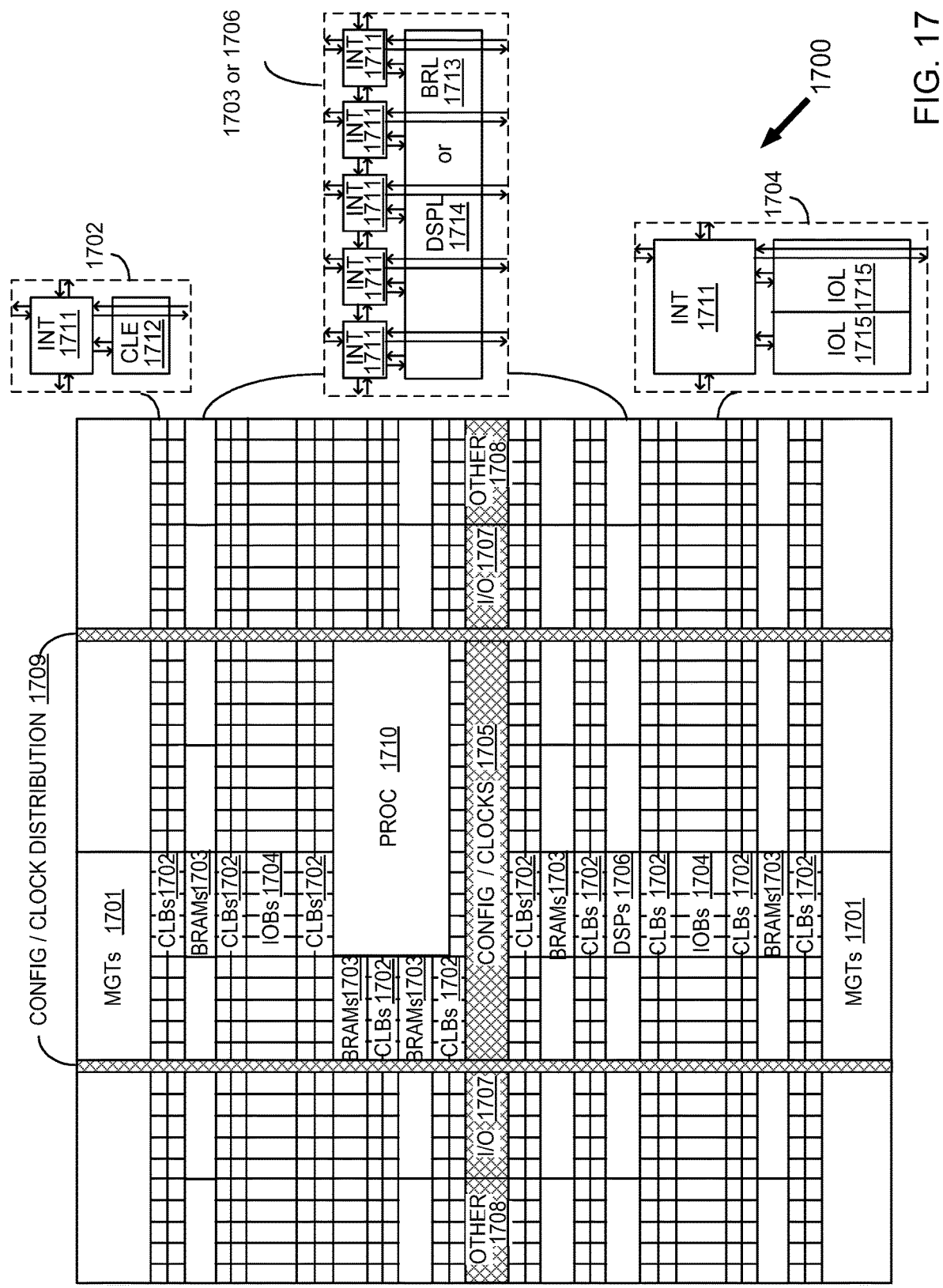
FIG. 17 is a block diagram of a device having programmable resources.

Turning now to FIG. 17, a block diagram of a device having programmable resources including the circuits of FIGS. 1-16 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL) device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 17 comprises an FPGA architecture 1700 having a large number of different programmable tiles including multi-gigabit transceivers (MGTs) 1701, CLBs 1702, random access memory blocks (BRAMs) 1703, input/output blocks (IOBs) 1704, configuration and clocking logic (CONFIG/CLOCKS) 1705, digital signal processing blocks (DSPs) 1706, specialized input/output blocks (I/O) 1707 (e.g., configuration ports and clock ports), and other programmable logic 1708 such as digital clock managers, analog-to-digital converters, system monitoring logic, and so forth. Some FPGAs also include dedicated processor blocks (PROC) 1710, which may be used to implement a software application, for example.

In some FPGAs, each programmable tile includes a programmable interconnect element (INT) 1711 having standardized connections to and from a corresponding interconnect element in each adjacent tile. Therefore, the programmable interconnect elements taken together implement the programmable interconnect structure for the illustrated FPGA. The programmable interconnect element 1711 also includes the connections to and from the programmable logic element within the same tile, as shown by the examples included at the top of FIG. 17.

For example, a CLB 1702 may include a configurable logic element (CLE) 1712 that may be programmed to implement user logic plus a single programmable interconnect element 1711. A BRAM 1703 may include a BRAM logic element (BRL) 1713 in addition to one or more programmable interconnect elements. The BRAM includes dedicated memory separate from the distributed RAM of a configuration logic block. Typically, the number of interconnect elements included in a tile depends on the height of the tile. In the pictured implementation, a BRAM tile has the same height as five CLBs, but other numbers may also be used. A DSP tile 1706 may include a DSP logic element (DSPL) 1714 in addition to an appropriate number of programmable interconnect elements. An IOB 1704 may include, for example, two instances of an input/output logic element (IOL) 1715 in addition to one instance of the programmable interconnect element 1711. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured implementation, a columnar area near the center of the die is used for configuration, clock, and other control logic. The config/clock distribution regions 1709 extending from this column are used to distribute the clocks and configuration signals across the breadth of the FPGA. Some FPGAs utilizing the architecture illustrated in FIG. 17 include additional logic blocks that disrupt the regular columnar structure making up a large part of the FPGA. The additional logic blocks may be programmable blocks and/or dedicated logic. For example, the processor block PROC 1710 shown in FIG. 17 spans several columns of CLBs and BRAMs.

Note that FIG. 17 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 17 are purely exemplary. For example, in an actual FPGA more than one adjacent column of CLBs is typically included wherever the CLBs appear in order to facilitate the efficient implementation of user logic. While the implementation of FIG. 17 relates to an integrated circuit having programmable resources, it should be understood that the circuits and methods set forth above could be implemented in any type of device having a combination of programmable resources and hard blocks.

Figure 18:
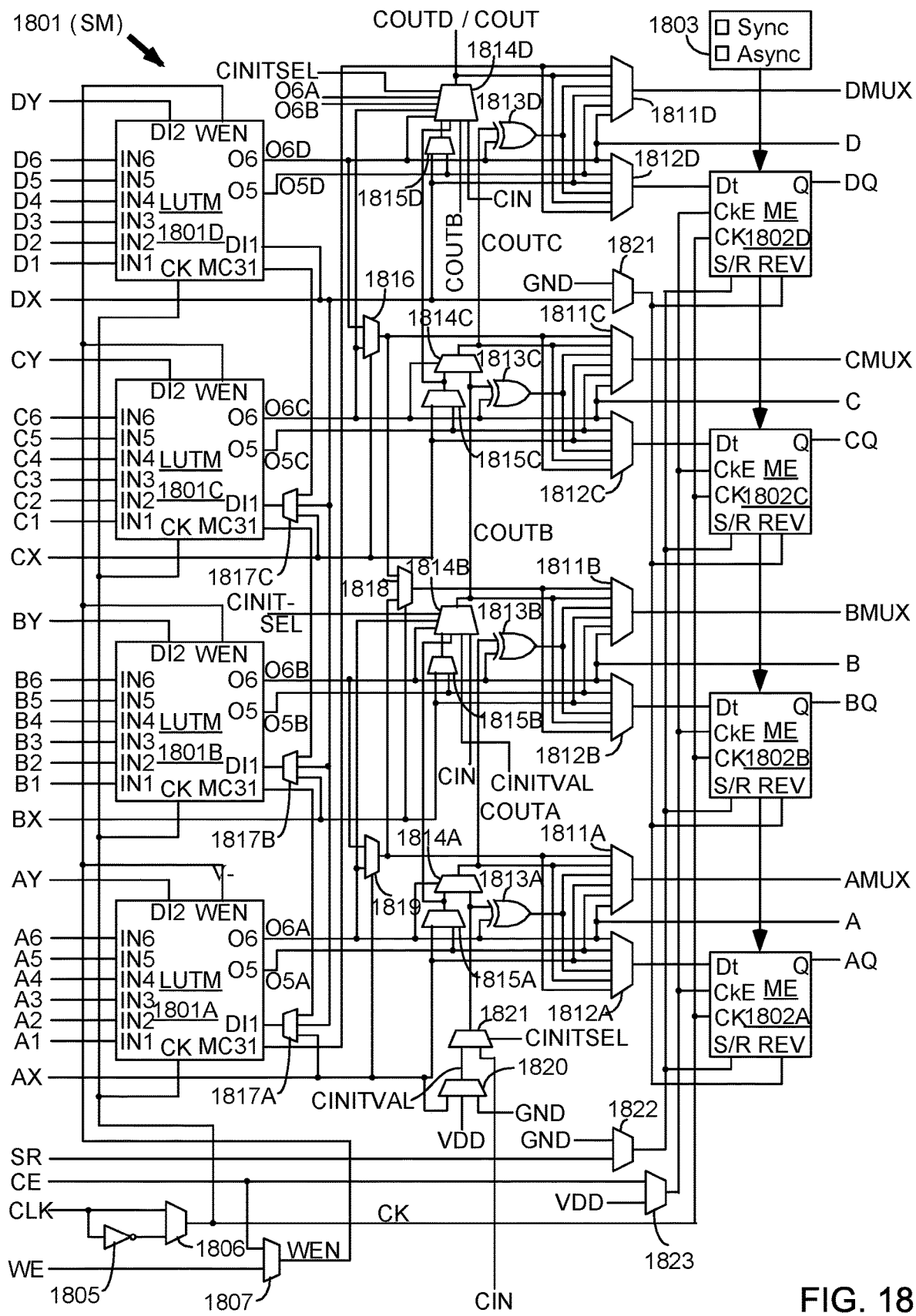
FIG. 18 is a block diagram of a configurable logic element of the device of FIG. 17.

Turning now to FIG. 18, block diagram of a configurable logic element of the device of FIG. 17 is shown. In particular, FIG. 18 illustrates in simplified form a configurable logic element, which is an example of Programmable Logic, of a configuration logic block 1702 of FIG. 17. In the implementation of FIG. 18, slice M 1801 includes four lookup tables (LUTMs) 1801A-1801D, each driven by six LUT data input terminals A1-A6, B1-B6, C1-C6, and D1-D6 and each providing two LUT output signals O5 and O6. The O6 output terminals from LUTs 1801A-1801D drive slice output terminals A-D, respectively. The LUT data input signals are supplied by the FPGA interconnect structure via input multiplexers, which may be implemented by programmable interconnect element 1811, and the LUT output signals are also supplied to the interconnect structure. Slice M also includes: output select multiplexers 1811A-1811D driving output terminals AMUX-DMUX; multiplexers 1812A-1812D driving the data input terminals of memory elements 1802A-1802D; combinational multiplexers 1816, 1818, and 1819; bounce multiplexer circuits 1822-1823; a circuit represented by inverter 1805 and multiplexer 1806 (which together provide an optional inversion on the input clock path); and carry logic having multiplexers 1814A-1814D, 1815A-1815D, 1820-1821 and exclusive OR gates 1813A-1813D. All of these elements are coupled together as shown in FIG. 18. Where select inputs are not shown for the multiplexers illustrated in FIG. 18, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 18 for clarity, as well as from other selected figures herein.

In the pictured implementation, each memory element 1802A-1802D may be programmed to function as a synchronous or asynchronous flip-flop or latch. The selection between synchronous and asynchronous functionality is made for all four memory elements in a slice by programming Sync/Asynch selection circuit 1803. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1802A-1802D are clocked by a clock signal CK, which may be provided by a global clock network or by the interconnect structure, for example. Such programmable memory elements are well known in the art of FPGA design. Each memory element 1802A-1802D provides a registered output signal AQ-DQ to the interconnect structure. Because each LUT 1801A-1801D provides two output signals, O5 and O6, the LUT may be configured to function as two 5-input LUTs with five shared input signals (IN1-IN5), or as one 6-input LUT having input signals IN1-IN6.

In the implementation of FIG. 18, each LUTM 1801A-1801D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1817A-1817C for LUTs 1801A-1801C), or to the two 32-bit RAMs via input terminals DI1 and DI2. RAM write operations in the LUT RAMs are controlled by clock signal CK from multiplexer 1806 and by write enable signal WEN from multiplexer 1807, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1801A may also be provided to the general interconnect structure for shift register chaining, via output select multiplexer 1811D and CLE output terminal DMUX. Accordingly, the circuits and methods set forth above may be implemented in a device such as the devices of FIGS. 17 and 18, or any other suitable device.

Figure 19:
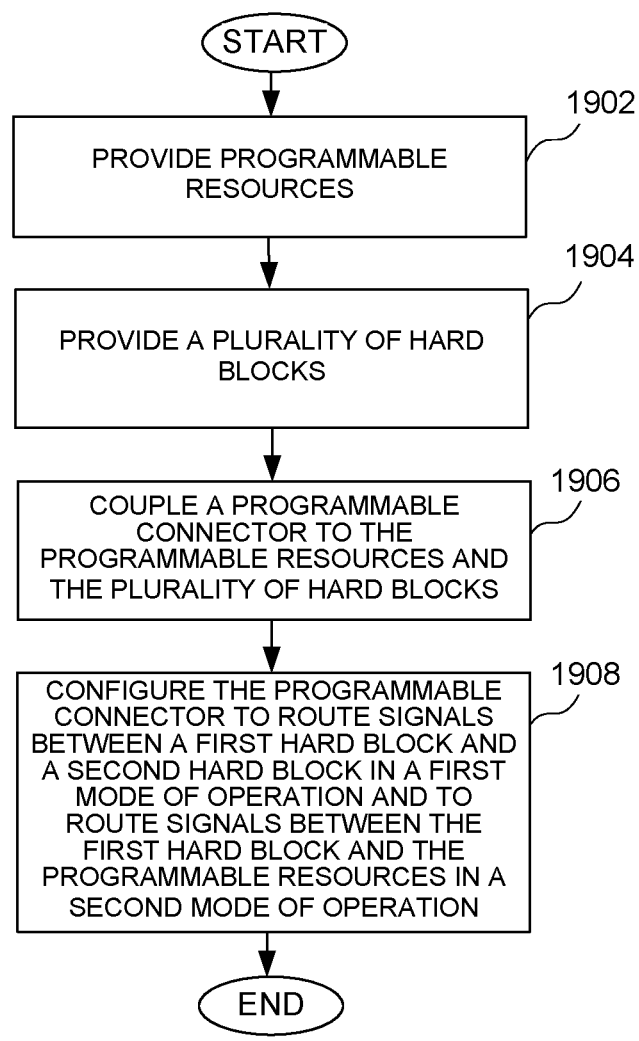
FIG. 19 is a flow diagram showing a method of implementing a programmable connector in an integrated circuit device.

Turning now to FIG. 19, a flow diagram shows a method of implementing a programmable connector in an integrated circuit device. More particularly, programmable resources are provided at a block 1902. The programmable resources, such as the programmable resources described in FIGS. 1, 16 and 17 for example. A plurality of hard blocks is provided at a block 1904. The hard blocks could include any hard wired circuits as described in reference to FIG. 1 or any of the other figures as described above. A programmable connector, such as programmable connector 120 for example, is coupled to the programmable resources and the plurality of hard blocks at a block 1906. The programmable connector configured to route signals between a first hard block and a second hard block in a first mode of operation and to route signals between the first hard block and the programmable resources in a second mode of operation at a block 1908. A first mode of operation could be a low power mode for example when the programmable resources are not powered up. For example, such arrangements may not support an arrangement where certain hard blocks of an integrated circuit device are always on while other portions of the integrated circuit device are reconfigurable and may be powered down. That is, in a first mode the programmable resources could be inactive. By way of example, the programmable resources may be inactive when they are not configured or are not configured and powered up. In the second mode, the programmable resources are powered up, and the programmable connector can enable communication between hard blocks, or between a hard block and the programmable resources. By way of example, the programmable resources could be active by being configured or configured and powered up. The second mode could include testing, as well as the debug operations and bypass operations as described above.

The method of FIG. 19 may be implemented using the circuits of FIGS. 1-18 as described, or using some other suitable circuits. While specific elements of the method are described, it should be understood that additional elements of the method, or additional details related to the elements, could be implemented according to the disclosure of FIGS. 1-18.

It can therefore be appreciated that new circuits for and methods of providing a programmable connector in an integrated circuit device have been described. It will be appreciated by those skilled in the art that numerous alternatives and equivalents will be seen to exist that incorporate the disclosed invention. As a result, the invention is not to be limited by the foregoing implementations, but only by the following claims.

What we claim is:

1. An integrated circuit comprising:
   programmable resources comprising configurable logic elements and input/output blocks;
   a plurality of hard blocks; and
   a programmable connector coupled to the programmable resources and the plurality of hard blocks;
   wherein the programmable connector is configurable to route signals between a first hard block of the plurality of hard blocks comprising a transceiver and a second hard block of the plurality of hard blocks comprising a communication interface in a first mode of operation and to route signals between the first hard block and a configurable logic element of the programmable resources in a second mode of operation;
   wherein the configurable logic element of the programmable resources is configurable to route signals to a first input/output block; and
   wherein the communication interface enables a communication of data received by the transceiver to a second input/output block.

2. The integrated circuit of claim 1, further comprising a bus interconnect element coupled between the programmable connector and the second hard block comprising a processor subsystem.

3. The integrated circuit of claim 1, wherein the first mode of operation comprises a low power mode.

4. The integrated circuit of claim 3, wherein programmable resources are inactive in the low power mode of operation.

5. The integrated circuit of claim 1, wherein the programmable resources are active during the second mode of operation.

6. The integrated circuit of claim 1, wherein the programmable connector provides dedicated connectivity between the transceiver and the second hard block comprising a processor subsystem.

7. The integrated circuit of claim 6, wherein the programmable connector is configurable to enable a debug mode for testing the programmable resources.

8. The integrated circuit of claim 6, wherein channels of the transceiver are configured as quad channels, and the programmable connector enables cascading between the quad channels.

9. The integrated circuit of claim 8, further comprising configurable pipeline registers for reducing skew between the quad channels.

10. The integrated circuit of claim 8, further comprising a clock selection circuit having programmable delay elements to balance clock skew between the quad channels.

11. A method of enabling a multi-mode operation of programmable resources, the method comprising:
    providing programmable resources comprising configurable logic elements and input/output blocks;
    providing a plurality of hard blocks;
    coupling a programmable connector to the programmable resources and the plurality of hard blocks;
    configuring the programmable connector to route signals between a first hard block of the plurality of hard blocks comprising a transceiver and a second hard block of the plurality of hard blocks comprising a communication interface in a first mode of operation and to route signals between the first hard block and a configurable logic element of the programmable resources in a second mode of operation;
    routing signals from the configurable logic element of the programmable resources to a first input/output block; and
    enabling, by way of the communication interface, a communication of data received by the transceiver to a second input/output block.

12. The method of claim 11, further comprising coupling a bus interconnect element between the programmable connector and the second hard block comprising a processor subsystem.

13. The method of claim 11, wherein the first mode of operation comprises a low power mode.

14. The method of claim 13, wherein programmable resources are inactive in the low power mode of operation.

15. The method of claim 11, wherein the programmable resources are active during the second mode of operation.

16. The method of claim 11, further comprising providing, using the programmable connector, dedicated connectivity between the transceiver and the second hard block comprising a processor subsystem.

17. The method of claim 16, further comprising configuring the programmable connector in a debug mode for testing the programmable resources.

18. The method of claim 16, further comprising configuring channels of the transceiver as quad channels, wherein the programmable connector enables cascading between the quad channels.

19. The method of claim 18 further comprising implementing a configurable pipeline registers for reducing skew between the quad channels.

20. The method of claim 18, further comprising implementing a clock selection circuit having programmable delay elements to balance clock skew between the quad channels.

* * * * *